(12) United States Patent
Kojima et al.

(10) Patent No.: US 12,156,475 B2
(45) Date of Patent: Nov. 26, 2024

(54) PIEZOELECTRIC DEVICE HAVING PLURALITY OF VIBRATING REGIONS AND ELECTRONIC APPARATUS

(71) Applicant: SEIKO EPSON CORPORATION, Tokyo (JP)

(72) Inventors: Chikara Kojima, Matsumoto (JP); Koji Ohashi, Matsumoto (JP); Hironori Suzuki, Chino (JP); Kanechika Kiyose, Matsumoto (JP); Katsuhiro Imai, Minowa-machi (JP); Yasuyuki Matsumoto, Azumino (JP); Takahiro Kamijo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 821 days.

(21) Appl. No.: 16/690,553

(22) Filed: Nov. 21, 2019

(65) Prior Publication Data

US 2020/0168784 A1  May 28, 2020

(30) Foreign Application Priority Data

Nov. 22, 2018  (JP) .................... 2018-219037

(51) Int. Cl.
| | | |
|---|---|---|
| *H01L 41/047* | (2006.01) | |
| *B06B 1/02* | (2006.01) | |
| *B06B 1/06* | (2006.01) | |
| *H01L 41/04* | (2006.01) | |
| *H01L 41/08* | (2006.01) | |
| *H10N 30/00* | (2023.01) | |
| *H10N 30/80* | (2023.01) | |

(Continued)

(52) U.S. Cl.
CPC ......... *H10N 30/875* (2023.02); *B06B 1/0215* (2013.01); *B06B 1/0629* (2013.01); *H10N 30/101* (2024.05); *H10N 30/802* (2023.02); *G01S 15/08* (2013.01)

(58) Field of Classification Search
CPC .............. H01L 41/042; H01L 41/0475; H01L 41/0825; B06B 1/0215; B06B 1/0629; G01S 15/08; H10N 30/802; H10N 30/875; H10N 30/1071
USPC .......................................... 310/316, 316.01
See application file for complete search history.

(56) References Cited

U.S. PATENT DOCUMENTS

2015/0188514 A1* 7/2015 Yamada ............... H03H 9/0547
                                                          310/370
2015/0258573 A1   9/2015 Kojima
(Continued)

FOREIGN PATENT DOCUMENTS

JP   2015-188208 A   10/2015
JP   2018-107571 A   7/2018

*Primary Examiner* — Emily P Pham
*Assistant Examiner* — Monica Mata
(74) *Attorney, Agent, or Firm* — Oliff PLC

(57) ABSTRACT

A piezoelectric device includes a substrate having opening portions, a vibrating plate provided to overlap with the substrate and having a plurality of vibrating regions overlapping with the opening portions in a plan view as seen from a thickness direction of the substrate, piezoelectric elements provided in the vibrating regions, and bypass wires provided outside of the vibrating regions of the vibrating plate and electrically coupled to the plurality of piezoelectric elements, wherein slits penetrating the bypass wires in the thickness direction are provided in the bypass wires.

5 Claims, 7 Drawing Sheets

(51) Int. Cl.
*H10N 30/87* (2023.01)
*G01S 15/08* (2006.01)

(56) References Cited

U.S. PATENT DOCUMENTS

| | | |
|---|---|---|
| 2015/0280103 A1* | 10/2015 | Kobayashi ............. B41J 2/1623 |
| | | 347/68 |
| 2017/0155029 A1* | 6/2017 | Kiyose ................. H10N 30/875 |
| 2017/0179365 A1* | 6/2017 | Yonemura ............. B06B 1/0622 |
| 2018/0170037 A1* | 6/2018 | Mcmullen ............ B41J 2/04541 |
| 2018/0182949 A1 | 6/2018 | Kojima et al. |
| 2018/0243795 A1 | 8/2018 | Kojima |

* cited by examiner

PIEZOELECTRIC DEVICE HAVING PLURALITY OF VIBRATING REGIONS AND ELECTRONIC APPARATUS

The present application is based on, and claims priority from JP Application Serial Number 2018-219037, filed Nov. 22, 2018, the disclosure of which is hereby incorporated by reference herein in its entirety.

BACKGROUND

1. Technical Field

The present disclosure relates to a piezoelectric device and electronic apparatus.

2. Related Art

In related art, piezoelectric devices such as ultrasonic devices including a plurality of piezoelectric elements formed by sequential stacking of first electrodes, piezoelectric material layers, and second electrodes on vibrating plates are known (for example, see JP-A-2018-107571).

In an ultrasonic device disclosed in JP-A-2018-107571, a plurality of piezoelectric elements are arranged on a vibrating plate, common bypass wires (wiring portions) are electrically coupled to first electrodes or second electrodes of the respective piezoelectric elements with respect to each of the plurality of piezoelectric elements. The bypass wires are placed to bypass vibrating regions in which the piezoelectric elements are placed on the vibrating plate and electrically coupled to the first electrodes or the second electrodes of the respective piezoelectric elements via coupling wires (coupling portions).

In the above described piezoelectric device disclosed in JP-A-2018-107571, the piezoelectric element deforms according to voltage application, and thereby, the vibrating region of the vibrating plate with the piezoelectric element placed thereon deforms. Concurrently, stress according to an amount of deformation of the vibrating region acts on a non-vibrating region adjacent to the vibrating region in the vibrating plate.

However, the bypass wires formed on the vibrating plate are placed in the non-vibrating regions adjacent to the vibrating regions because of the design of the wires electrically coupled to the plurality of piezoelectric elements. Accordingly, when the vibrating regions deform, the stress acting on the non-vibrating regions may be transferred to the bypass wires and cracking may occur in the bypass wires.

SUMMARY

A piezoelectric device according to an aspect of the present disclosure includes a substrate having opening portions, a vibrating plate provided to overlap with the substrate and having a plurality of vibrating regions overlapping with the opening portions in a plan view as seen from a thickness direction of the substrate, piezoelectric elements provided in the vibrating regions, and bypass wires provided outside of the vibrating regions of the vibrating plate and electrically coupled to the plurality of piezoelectric elements, wherein slits penetrating the bypass wires in the thickness direction are provided in the bypass wires.

In the piezoelectric device according to the aspect of the present disclosure, the plurality of slits may be intermittently provided along wiring directions of the bypass wires.

In the piezoelectric device according to the aspect of the present disclosure, the slits may divide the bypass wires in width directions, and auxiliary wires electrically coupling parts divided by the slits and formed using a material having higher flexibility than that of the bypass wires may be provided in the bypass wires.

In the piezoelectric device according to the aspect of the present disclosure, the plurality of slits may be provided side by side in the width directions of the bypass wires.

An electronic apparatus according to an aspect of the present disclosure includes anyone of the above described piezoelectric devices, a drive circuit that drives the piezoelectric device, and a control unit that controls the piezoelectric device via the drive circuit.

DESCRIPTION OF EXEMPLARY EMBODIMENTS

First Embodiment

A piezoelectric device 10 according to one embodiment of the present disclosure will be explained with reference to FIGS. 1 to 4.

Figure 1:
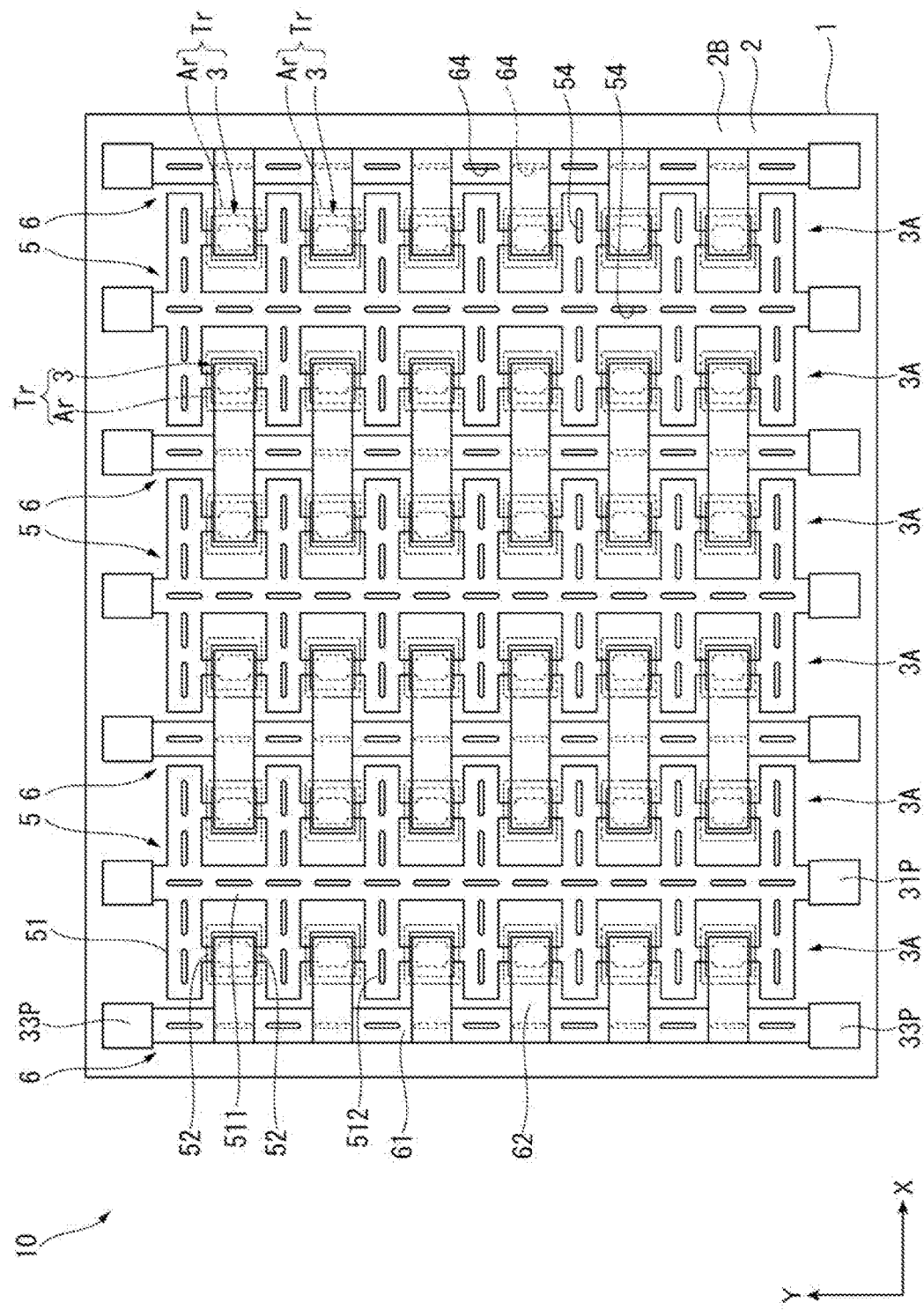
FIG. 1 is a plan view showing a schematic configuration of a piezoelectric device according to a first embodiment.
Figure 2:
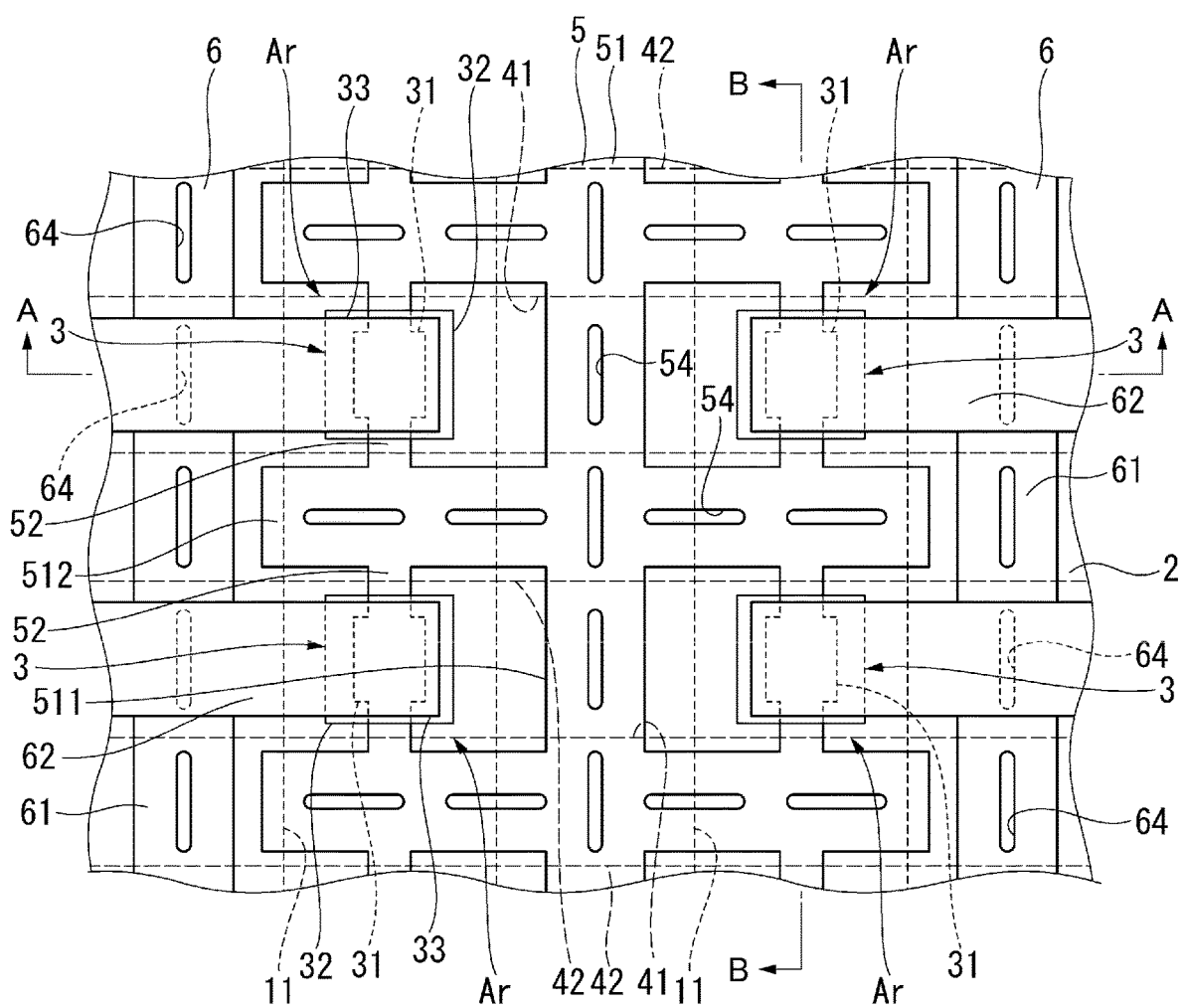
FIG. 2 is an enlarged view showing a part of FIG. 1.
Figure 3:
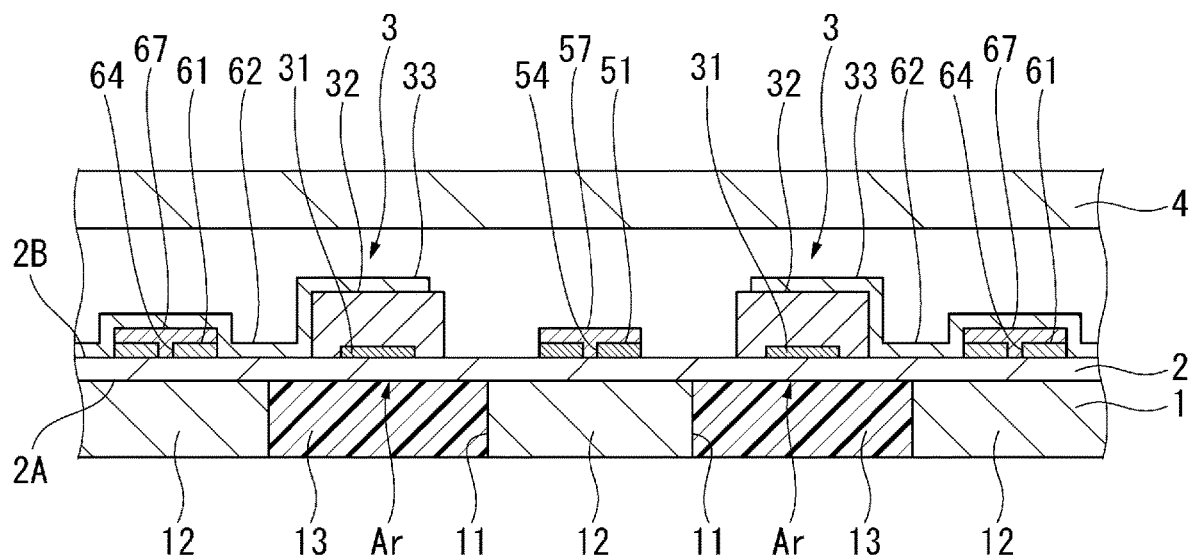
FIG. 3 is a sectional view of the piezoelectric device corresponding to line A-A in FIG. 2.
Figure 4:
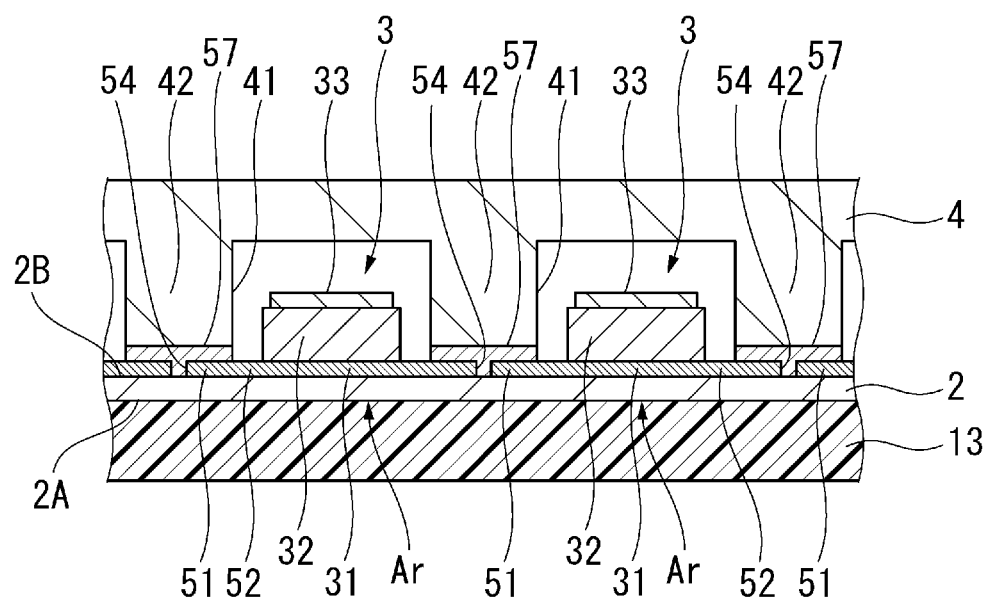
FIG. 4 is a sectional view of the piezoelectric device corresponding to line B-B in FIG. 2.

FIG. 1 is the plan view of a part of the piezoelectric device 10 as seen from a thickness direction, FIG. 2 is the enlarged view showing the part of FIG. 1, FIG. 3 is the sectional view of the piezoelectric device 10 corresponding to line A-A in FIG. 2, and FIG. 4 is the sectional view of the piezoelectric device 10 corresponding to line B-B in FIG. 2.

Overall Configuration of Piezoelectric Device

The piezoelectric device 10 includes a substrate 1, a vibrating plate 2 provided on a principal surface at one side of the substrate 1, a plurality of piezoelectric elements 3 provided on the vibrating plate 2, and a sealing plate 4 coupled to the vibrating plate 2 to cover these piezoelectric elements 3. Note that, in FIGS. 1 and 2, illustration of the sealing plate 4 is omitted.

In the following description, a thickness direction of the substrate 1 is a Z direction, and two axis directions orthogonal to the Z direction are respectively a Y direction and an X direction.

The substrate 1 is a semiconductor substrate of silicon or the like. A plurality of opening portions 11 penetrating the substrate 1 in the Z direction are provided in the substrate 1. The plurality of opening portions 11 are arranged along the X direction and the length dimension of the opening portion 11 along the Y direction is set to be larger than the length dimension of the opening portion 11 along the X direction.

Of the substrate 1, parts surrounding the opening portions 11 are referred to as wall portions 12. The wall portions 12 partition the opening portions 11 adjacent to each other in the X direction.

The opening portions 11 of the substrate 1, i.e., spaces surrounded by the wall portions 12 are filled with damping layers 13 of silicone resin or the like. The damping layers 13 have functions of reducing the time until vibration of the vibrating plate 2, which will be described later, converges and suppressing vibration propagation (crosstalk) between vibrating regions Ar, which will be described later.

Note that the amount of filling of the damping layer 13 for the opening portion 11 can be arbitrarily set and not all the opening portion 11 may necessarily be filled with the damping layer 13. Or, the opening portion 11 may not necessarily be filled with the damping layer 13.

The vibrating plate 2 is a stacking structure of e.g. silicon oxide and zirconium oxide. The vibrating plate 2 is provided on the principal surface at one side of the substrate 1 to cover the opening portions 11 of the substrate 1. In other words, the vibrating plate 2 is supported by the wall portions 12 of the substrate 1. The thickness dimension of the vibrating plate 2 in the Z direction is sufficiently small relative to the thickness dimension of the substrate 1.

As below, of the vibrating plate 2, a surface at one side in the Z direction is a first surface 2A and a surface at the other side in the Z direction is a second surface 2B. The substrate 1 is in contact with the first surface 2A of the vibrating plate 2, and the plurality of piezoelectric elements 3 are provided in an array form on the second surface 2B of the vibrating plate 2.

The sealing plate 4 has a plurality of grooves 41 provided to house the piezoelectric elements 3 on the vibrating plate 2, and seals surrounding spaces with respect to each of the plurality of piezoelectric elements 3.

Further, in the sealing plate 4, through holes (not shown) for insertion of wiring portions (FPC or the like) coupled to first electrode terminals 31P and second electrode terminals 33P, which will be described later, are provided.

The sealing plate 4 has a plurality of partition walls 42 projecting from the bottom part sides of the grooves toward the vibrating plate 2 side. The plurality of partition walls 42 respectively extend along the X direction and are arranged at predetermined spaces along the Y direction. The respective partition walls 42 couple to the second surface 2B of the vibrating plate 2 via other members (bypass wires 51 or the like, which will be described later) between the piezoelectric elements 3 adjacent to each other in the Y direction.

Here, the wall portions 12 of the substrate 1 couple to the first surface 2A side of the vibrating plate 2, and the partition walls 42 of the sealing plate 4 couple to the second surface 2B side of the vibrating plate 2. Thereby, of the vibrating plate 2, in a plan view as seen from the Z direction, the respective regions overlapping with the opening portions 11 and surrounded by the wall portions 12 and the partition walls 42 in the plan view are the vibrating regions Ar that can vibrate. In other words, in the vibrating plate 2, the wall portions 12 are in contact between the vibrating regions Ar adjacent to each other in the Y direction, and the partition walls 42 are in contact between the vibrating regions Ar adjacent to each other in the X direction.

The piezoelectric element 3 has a first electrode 31, a piezoelectric material 32, and a second electrode 33 and these are sequentially stacked on the second surface 2B in the vibrating region Ar of the vibrating plate 2. The first electrode 31 and the second electrode 33 are formed by conducting layers (single-layered or multilayered) of e.g. iridium, titanium, or the like, and the piezoelectric material 32 is formed by e.g. PZT (lead zirconate titanate).

The piezoelectric element 3 is provided on each vibrating region Ar of the vibrating plate 2, and a single ultrasonic transducer Tr is formed by a combination of the vibrating region Ar and the piezoelectric element 3. In the piezoelectric device 10 of the embodiment, a plurality of the ultrasonic transducers Tr are arranged in a matrix form along the Y direction and the X direction.

In the ultrasonic transducer Tr, when a pulsed voltage having a predetermined frequency is applied between the first electrode 31 and the second electrode 33, the piezoelectric material 32 flexes, the vibrating region Ar vibrates, and thereby, ultrasonic waves are transmitted.

Further, when ultrasonic waves propagating toward the piezoelectric device 10 vibrate the vibrating region Ar of the vibrating plate 2, a potential difference is generated between the upside and the downside of the piezoelectric material 32 in the vibrating region Ar. Accordingly, received ultrasonic waves can be detected by detection of the potential difference generated between the first electrode 31 and the second electrode 33.

Note that, in FIG. 1, for convenience, the number of the ultrasonic transducers Tr is smaller than the actual number.

Configurations of Wires

The piezoelectric device 10 has first wires 5 coupled to the plurality of first electrodes 31 and second wires 6 coupled to the plurality of second electrodes 33.

As below, the first wires 5 and the second wires 6 will be explained. Note that, hereinafter, the row of the piezoelectric elements 3 arranged in the Y direction is referred to as "element group 3A".

The first wires 5 include first bypass wires 51 provided on the second surface 2B of the vibrating plate 2 and electrically coupled to an external drive circuit or the like, and first coupling wires 52 that couple the first electrodes 31 of the respective piezoelectric elements 3 and the first bypass wires 51. Note that, in the embodiment, the single first wire 5 is placed for two element groups 3A, and a plurality of the first coupling wires 52 are coupled to the single first bypass wire 51 in each first wire 5.

The first bypass wire 51 is placed outside of the vibrating regions Ar on the second surface 2B of the vibrating plate 2 and extends along the Y direction or X direction. Specifically, the first bypass wire 51 has a Y-direction bypass wire 511 formed along the Y direction and a plurality of X-direction bypass wires 512 formed along the X direction.

The Y-direction bypass wire 511 has end portions in the Y direction extended to the peripheral edge parts of the substrate 1 and the first electrode terminals 31P are provided in the end portions.

The plurality of X-direction bypass wires 512 are placed with the piezoelectric elements 3 in between in the Y direction and coupled to the Y-direction bypass wire 511 in parts in which the wires cross the direction bypass wire 511.

The first coupling wire 52 couples the first electrode 31 of the piezoelectric element 3 and the X-direction bypass wire 512 placed at one side in the Y direction of the piezoelectric element 3. The first coupling wires 52 are coupled to both sides in the Y direction of the first electrode 31 of the piezoelectric element 3.

Note that, in the embodiment, the first bypass wires 51 and the first coupling wires 52 are integrally formed and clear boundaries are not provided between these wires. Of the first wire 5, a position where an end portion in a wiring direction of the first coupling wire 52 is in contact with an end portion in a width direction of the first bypass wire 51 may be regarded as a boundary between the first bypass wire 51 and the first coupling wire 52.

Here, the wiring direction refers to a direction corresponding to the longitudinal direction of the wire (the extension direction of the wire; the direction in which a current conducts) in the directions parallel to the second surface 2B of the vibrating plate 2. Further, the width direction of the wire refers to a direction parallel to the second surface 2B of the vibrating plate 2 and orthogonal to the wiring direction. The width of the wire is a dimension of the wire in the above described width direction.

The second wires 6 include second bypass wires 61 provided on the second surface 2B of the vibrating plate 2 and electrically coupled to an external drive circuit or the like, and second coupling wires 62 that couple the second electrodes 33 of the respective piezoelectric elements 3 and the second bypass wires 61. Note that, in the embodiment, the second wires 6 are placed alternately with the first wires 5 in the Y direction and, in each second wire 6, a plurality of the second coupling wires 62 are coupled to the single second bypass wire 61.

The second bypass wire 61 is placed outside of the vibrating regions Ar on the second surface 2B of the vibrating plate 2 and extends along the Y direction. The second bypass wire 61 has end portions in the Y direction extended to the peripheral edge parts of the substrate 1 and the second electrode terminals 33P are provided in the end portions.

The second coupling wire 62 couples the second electrode 33 of the piezoelectric element 3 and the second bypass wire 61 placed at one side in the X direction of the piezoelectric element 3. The second coupling wire 62 is coupled to the second electrode 33 of the piezoelectric element 3 at one side in the X direction.

Note that, in the embodiment, in the plan view of the piezoelectric device 10 as seen from the Z direction, the first bypass wires 51 are placed at three sides and the second bypass wire 61 is placed at the other one side of the four sides of the piezoelectric element 3. Thereby, the piezoelectric element 3 is surrounded at the four sides by the first bypass wires 51 and the second bypass wire 61.

Here, the first coupling wires 52 are placed inside and outside of the vibrating regions Ar, and thereby, couple the first electrodes 31 placed inside of the vibrating regions Ar and the first bypass wires 51 placed outside of the vibrating regions Ar. Further, the first coupling wires 52 are in close contact with the vibrating plate 2 integrally with the first electrodes 31 unlike the second coupling wires 62.

Accordingly, if the first coupling wires 52 have larger widths and flexibility of the first coupling wires 52 is lower, the vibration of the vibrating regions Ar may be hindered.

In the embodiment, the widths of the first coupling wires 52 are set to be sufficiently small values so that the first coupling wires 52 may not hinder the vibration of the vibrating regions Ar.

Or, if the respective widths of the first bypass wires 51 and the second bypass wires 61 are smaller, electrical resistances of the respective wires are larger and characteristics of the piezoelectric elements 3 are lower.

In the embodiment, the respective widths of the first bypass wires 51 and the second bypass wires 61 are set to be sufficiently large values so that the electrical resistances of themselves may be suppressed and the piezoelectric elements 3 may have sufficient characteristics.

Slits

In the embodiment, a plurality of first slits 54 are provided for the first bypass wires 51 and a plurality of second slits 64 are provided for the second bypass wires 61.

Note that the first slit 54 and the second slit 64 have the same configuration as each other. As below, the first slits 54 and the second slits 64 may be referred to as the slits 54, 64. Further, the first bypass wires 51 and the second bypass wires 61 may be referred to as the bypass wires 51, 61. The bypass wires 51, 61 respectively correspond to bypass wires according to the present disclosure.

The slits 54, 64 penetrate the bypass wires 51, 61 in the thickness direction (Z direction) in the center parts in the width directions of the bypass wires 51, 61. The plurality of slits 54, 64 are intermittently provided along the wiring directions in the bypass wires 51, 61.

Further, the slits 54, 64 have shapes extending along the wiring directions of the parts of the bypass wires 51, 61 in which the slits 54, 64 are provided.

Specifically, of the first bypass wires 51, the first slits 54 provided in the Y-direction bypass wires 511 have rectangular shapes extending along the Y direction and the first slits 54 provided in the X-direction bypass wires 512 have rectangular shapes extending along the X direction. The second slits 64 provided in the second bypass wires 61 have rectangular shapes extending along the X direction. Further, the respective corner portions of the rectangular shapes by the first slits 54 and the second slits 64 are formed in curved shapes in the plan view as seen from the Z direction.

Note that, in the embodiment, auxiliary wires 57, 67 are provided for the bypass wires 51, 61 to fill the slits 54, 64. The auxiliary wires 57, 67 are e.g. gold wires and formed using a material having higher flexibility than that of the bypass wires 51, 61. In FIGS. 1 and 2, the illustration of the auxiliary wires 57, 67 is omitted.

Functions and Effects of Embodiment

In the embodiment, the slits 54, 64 penetrating the bypass wires 51, 61 in the thickness direction (Z direction) are provided in the bypass wires 51, 61 electrically coupled to the plurality of piezoelectric elements 3. Accordingly, the bypass wires 51, 61 easily flex by the force acting from the direction orthogonal to the thickness direction.

In the above described configuration, when the vibrating regions Ar of the vibrating plate 2 vibrate, stress acting on the bypass wires 51, 61 via the vibrating plate 2 is relaxed by the slits 54, 64. Thereby, cracking in the bypass wires 51, 61 may be suppressed.

Particularly, in the embodiment, the bypass wires 51, 61 have sufficiently large widths for reduction of the electrical resistances of themselves. Even in the configurations, cracking in the bypass wires 51, 61 is suppressed because of the presence of the slits 54, 64.

Further, in the embodiment, the bypass wires 51, 61 are provided between the adjacent two vibrating regions Ar in the vibrating plate 2, and the slits 54, 64 are placed between the two vibrating regions Ar. According to the configuration, part of the vibration generated in some vibrating regions Ar is reflected by the section parts of the slits 54, 64 in the bypass wires 51, 61, and thereby, transmission to the other vibrating regions Ar is suppressed. That is, in the embodiment, crosstalk in the vibrating plate 2 may be suppressed because of the presence of the slits 54, 64.

In the embodiment, the plurality of slits 54, 64 are intermittently provided along the wiring directions in the bypass wires 51, 61. According to the configuration, in the bypass wires 51, 61, the slits 54, 64 may be preferably placed in each of the parts adjacent to the vibrating regions Ar. Further, the slits 54, 64 do not completely divide the bypass wires 51, 61, and thus, the auxiliary wires 57, 67 may not necessarily be provided for the bypass wires 51, 61.

Second Embodiment

Next, the second embodiment will be explained. In the second embodiment, a distance sensor 100 as an example of an electronic apparatus including the piezoelectric device 10 described in the first embodiment will be explained.

Figure 5:
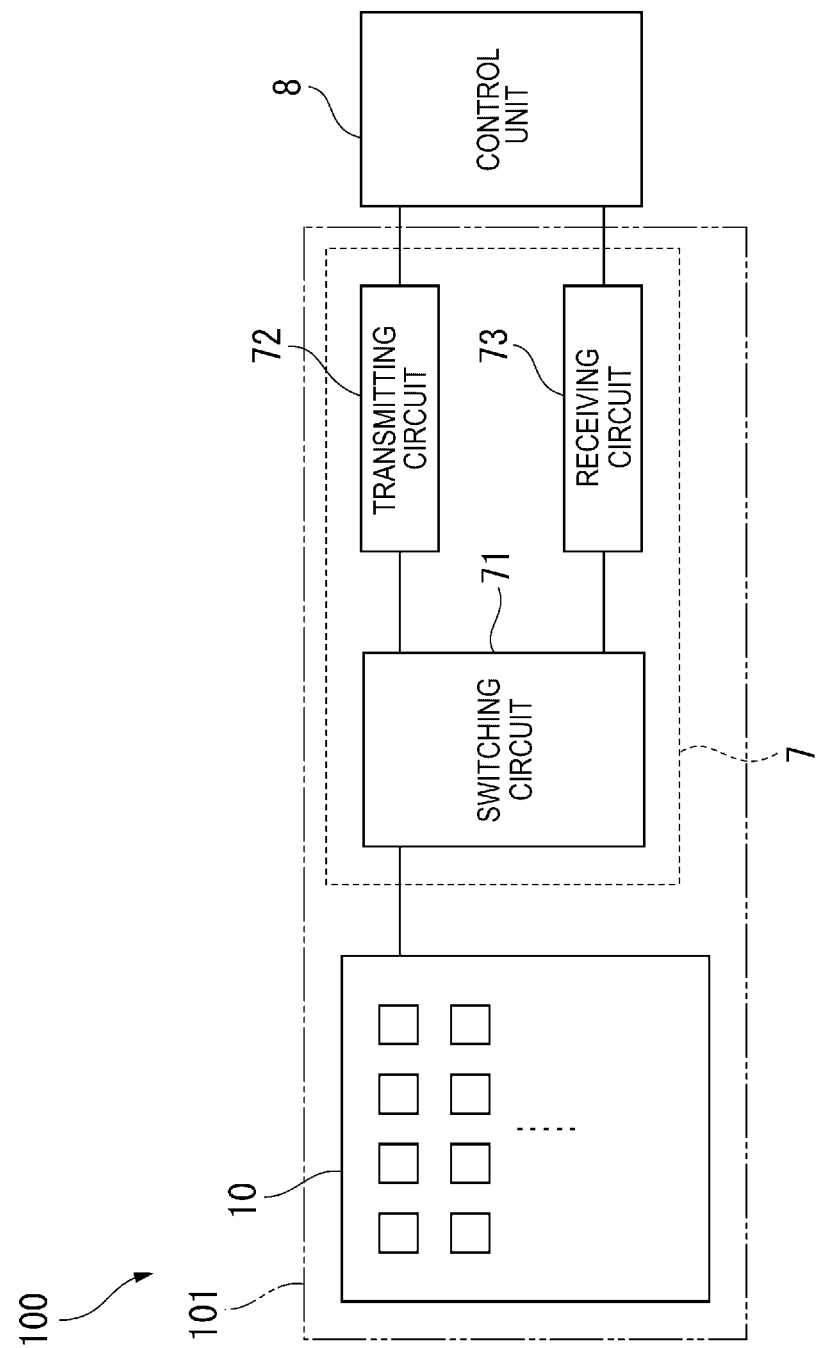
FIG. 5 is a block diagram showing a schematic configuration of an ultrasonic sensor according to a second embodiment.

As shown in FIG. 5, the distance sensor 100 of the embodiment includes an ultrasonic module 101 containing the piezoelectric device 10 and a drive circuit 7, and a control unit 8 that controls the ultrasonic module 101.

The drive circuit 7 includes a switching circuit 71, a transmitting circuit 72, and a receiving circuit 73.

The switching circuit 71 is coupled to the piezoelectric device 10 (specifically, the first electrode terminals 31P and the second electrode terminals 33P in the first embodiment), the transmitting circuit 72, and the receiving circuit 73. The switching circuit 71 includes a switching circuit, and switches between transmission coupling for coupling the piezoelectric device 10 and the transmitting circuit 72 and reception coupling for coupling the piezoelectric device 10 and the receiving circuit 73.

The transmitting circuit 72 is coupled to the switching circuit 71 and the control unit 8 and, when the switching circuit 71 is switched to the transmission coupling, outputs drive signals based on the control of the control unit 8 and transmits ultrasonic waves from the piezoelectric device 10.

The receiving circuit 73 is coupled to the switching circuit 71 and the control unit 8, to which reception signals from the piezoelectric device 10 are input when the switching circuit 71 is switched to the reception coupling. The receiving circuit 73 includes e.g. a linear noise amplifier, A/D converter, etc., and performs respective signal processing of conversion of the input reception signals into digital signals, removal of noise components, amplification to desired signal levels, etc. and outputs the processed reception signals to the control unit 8.

The control unit 8 includes e.g. a CPU (Central Processing Unit) or the like. The control unit 8 controls the piezoelectric device 10 via the drive circuit 7 and performs transmission and reception processing of ultrasonic waves using the piezoelectric device 10. Further, the control unit 8 acquires position information of an object based on the reception signals input from the piezoelectric device 10. For example, when the ToF (Time of Flight) method is used, a distance from the piezoelectric device 10 to the object may be calculated using a time from a transmission time at which the ultrasonic waves are transmitted from the piezoelectric device 10 to the reception of the reception signals and the acoustic velocity in the air.

In addition, the control unit 8 may include a memory unit that stores various kinds of data, various programs, etc. for control of the distance sensor 100.

Modified Examples

The present disclosure is not limited to the above described respective embodiments. The present disclosure includes modifications and improvements within the range in which the purpose of the present disclosure may be achieved.

In the first embodiment, the bypass wires 51, 61 have the plurality of slits 54, 64 intermittently placed in the wiring directions, however, the numbers, placements, shapes of the slits 54, 64 are not limited to those.

Figure 6:
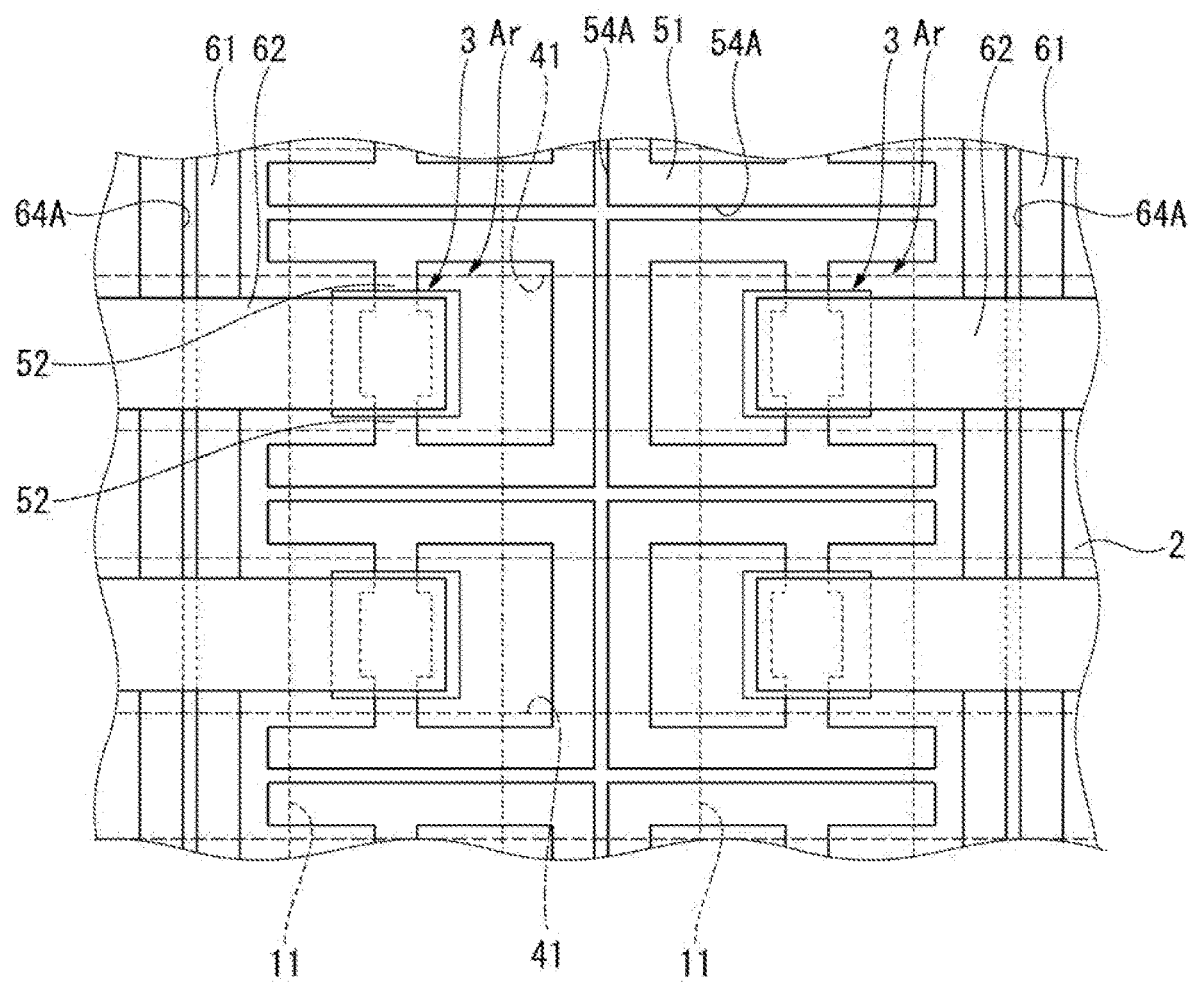
FIG. 6 shows a modified example of the piezoelectric device according to the first embodiment.

For example, as shown in FIG. 6, first slits 54A and second slits 64A (slits 54A, 64A) may be provided to completely divide the bypass wires 51, 61 in the width directions. In other words, the slits 54A, 64A may penetrate the bypass wires 51, 61 in the wiring directions of the parts of the bypass wires 51, 61 in which the slits 54A, 64A are provided.

Figure 7:
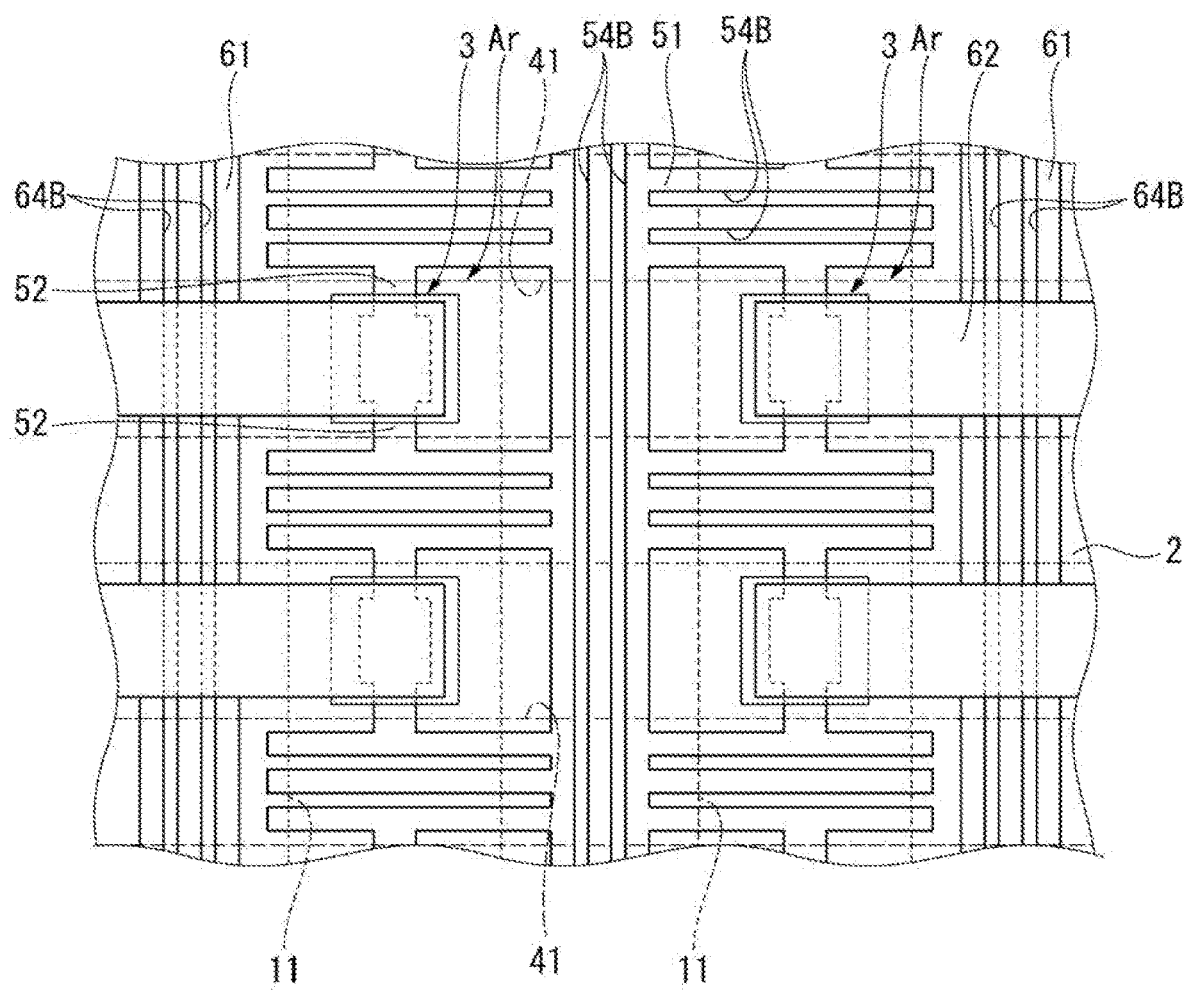
FIG. 7 shows a modified example of the piezoelectric device according to the first embodiment.

Further, as shown in FIG. 7, a plurality of first slits 54B and second slits 64B (slits 54B, 64B) that completely divide the bypass wires 51, 61 in the width directions may be placed side by side in the width directions of the bypass wires 51, 61.

According to the configuration shown in FIG. 6 or FIG. 7, the bypass wires 51, 61 flex more easily when stress acts in the width directions thereof. Thereby, cracking in the bypass wires 51, 61 may be suppressed more preferably.

Note that, in the configuration shown in FIG. 6 or FIG. 7, auxiliary wires like the auxiliary wires 57, 67 of the first embodiment are provided. The auxiliary wires electrically couple the parts divided by the slits 54A, 64A, 54B, 64B in the bypass wires 51, 61. Here, the auxiliary wires are formed using a material having higher flexibility than that of the bypass wires 51, 61, and thereby, the bypass wires 51, 61 may flex without being hindered by the auxiliary wires.

Or, as another modified example, a plurality of the slits 54, 64 intermittently placed in the wiring directions of the bypass wires 51, 61 may be placed side by side in the width directions of the bypass wires 51, 61. Or, the slits 54, 64 may be placed in a staggered manner in the bypass wires 51, 61.

Or, the shapes of the slits 54, 64 are not limited to the rectangular shapes or linear shapes, but may be other shapes including circular shapes and wavy shapes.

In the first embodiment, both of the bypass wires 51, 61 are formed and the respective bypass wires 51, 61 have the slits 54, 64, however, the present disclosure is not limited that.

For example, the bypass wires 51 or the bypass wires 61 may not necessarily have the slits 54, 64. Or, the bypass wires 51 or the bypass wires 61 are not formed on the vibrating plate 2, but linear electrode layers forming a plurality of the first electrodes 31 or a plurality of the second electrodes 33 may be formed instead.

In the second embodiment, the distance sensor 100 is exemplified as the example of the electronic apparatus including the piezoelectric device 10, however, the apparatus is not limited to that. For example, the piezoelectric device according to the present disclosure may be used for an inkjet head that ejects ink droplets by driving the piezoelectric elements, a pressure sensor that measures pressure of a pressure medium from amounts of displacement of the piezoelectric elements, or the like.

What is claimed is:

1. A piezoelectric device comprising:
    a substrate having opening portions;
    a vibrating plate provided to overlap with the substrate and having a plurality of vibrating regions overlapping with the opening portions in a plan view as seen from a thickness direction of the substrate, the vibrating plate overlapping with each of the opening portions of the substrate;
    a plurality of piezoelectric elements provided in the plurality of vibrating regions; and
    bypass wires electrically coupled to the plurality of piezoelectric elements, the bypass wires being electrically conductive wires, the bypass wires not overlapping with the plurality of vibrating regions of the vibrating plate in the plan view as seen from the thickness direction of the substrate, wherein a plurality of slits penetrating the bypass wires in the thickness direction are provided in the bypass wires, the plurality of slits includes a first slit provided in a first bypass wire of the plurality of bypass wires, the first slit extends along a direction in which electric current passes through the first bypass wire, and the first slit is filled with a conductive material having a higher flexibility than that of the bypass wire.

2. The piezoelectric device according to claim 1, wherein the plurality of slits are intermittently provided along wiring directions of the bypass wires.

3. The piezoelectric device according to claim 1, wherein the plurality of slits are provided side by side in width directions of the bypass wires.

4. An electronic apparatus comprising:

the piezoelectric device according to claim 1;

a drive circuit that drives the piezoelectric device; and a control unit that controls the piezoelectric device via the drive circuit.

5. The piezoelectric device according to claim 1, wherein the bypass wires are not provided with auxiliary wires.

* * * * *